US009690652B2

(12) United States Patent
Kanno

(10) Patent No.: US 9,690,652 B2
(45) Date of Patent: Jun. 27, 2017

(54) SEARCH DEVICE AND SEARCH METHOD SEARCHING DATA BASED ON KEY

(71) Applicant: Kabushiki Kaisha Toshiba, Minato-ku, Tokyo (JP)

(72) Inventor: Shinichi Kanno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 14/816,794

(22) Filed: Aug. 3, 2015

(65) Prior Publication Data
US 2016/0210191 A1     Jul. 21, 2016

Related U.S. Application Data

(66) Substitute for application No. 62/104,298, filed on Jan. 16, 2015.

(30) Foreign Application Priority Data

Feb. 17, 2015   (JP) .................................. 2015-028417

(51) Int. Cl.
*G11C 29/00*       (2006.01)
*G06F 11/10*       (2006.01)
(Continued)

(52) U.S. Cl.
CPC ........ *G06F 11/1068* (2013.01); *G06F 3/0619* (2013.01); *G06F 3/0659* (2013.01);
(Continued)

(58) Field of Classification Search
CPC .. G06F 11/1068; G06F 11/085; G06F 3/0619; G06F 3/0659; G06F 3/0679; G11C 29/42; G11C 29/52
See application file for complete search history.

(56) References Cited

U.S. PATENT DOCUMENTS 7,304,873 B1 * 12/2007 Gupta ................. G06F 11/1068
365/189.07
2010/0107034 A1    4/2010 Tsurukiri et al.
(Continued)

FOREIGN PATENT DOCUMENTS

JP          03-008175      1/1991
JP          2012-008651 A  1/2012
JP          2014-021752 A  2/2014

*Primary Examiner* — Sam Rizk
(74) *Attorney, Agent, or Firm* — White & Case LLP

(57) ABSTRACT

According to one embodiment, a search device includes a first comparison module, a determination module, a correction module, a second comparison module, and a search module. The first comparison module compares a received first key with a second key read from a nonvolatile memory. The determination module determines whether error correction is possible based on a first comparison result obtained by the first comparison module. The correction module generates a third key by applying an error correction process to the second key if the determination module determines that error correction is possible. The second comparison module compares the first key with the third key. The search module reads data associated with the second key in the nonvolatile memory if a second comparison result obtained by the second comparison module shows a match.

18 Claims, 7 Drawing Sheets

(51) Int. Cl.
    *G06F 3/06*          (2006.01)
    *G06F 11/08*        (2006.01)
    *G11C 29/52*        (2006.01)
    *G11C 29/42*        (2006.01)
    *G11C 29/04*        (2006.01)

(52) U.S. Cl.
    CPC .......... *G06F 3/0679* (2013.01); *G06F 11/085* (2013.01); *G11C 29/42* (2013.01); *G11C 29/52* (2013.01); *G11C 2029/0411* (2013.01)

(56) References Cited

U.S. PATENT DOCUMENTS

2011/0029841 A1*   2/2011   Rho .................... G06F 11/1068
                                                                 714/763
2011/0314204 A1   12/2011   Ootsuka et al.
2014/0025865 A1    1/2014   Marukame et al.

* cited by examiner

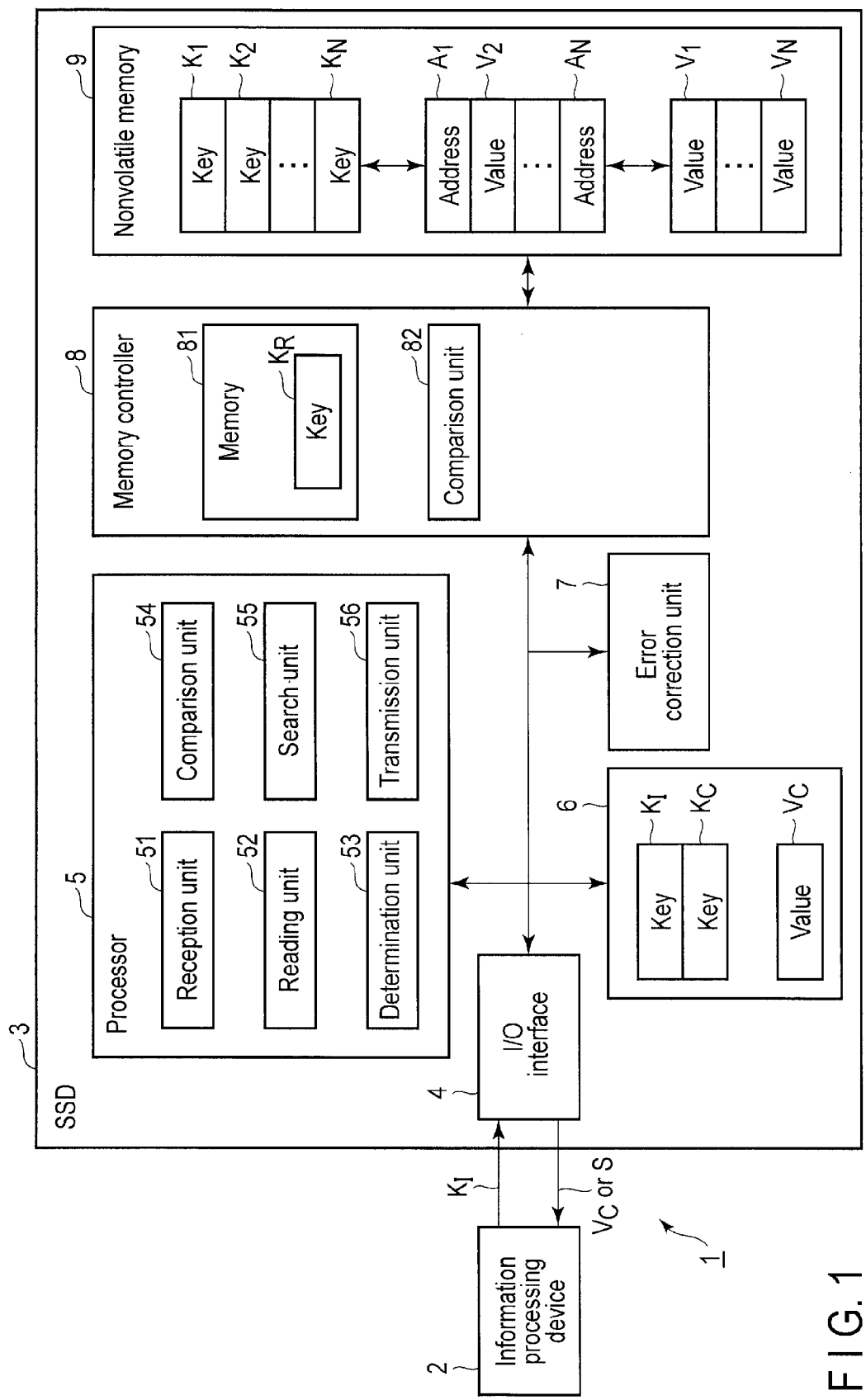
F I G. 1

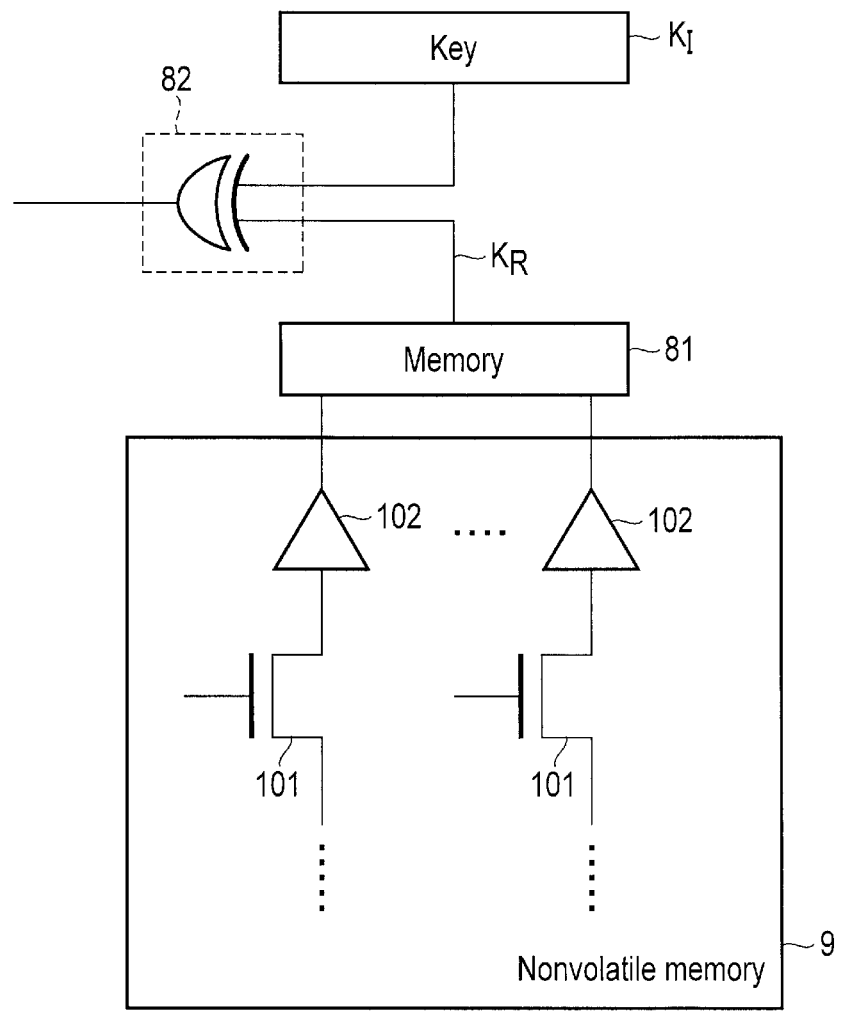
F I G. 3

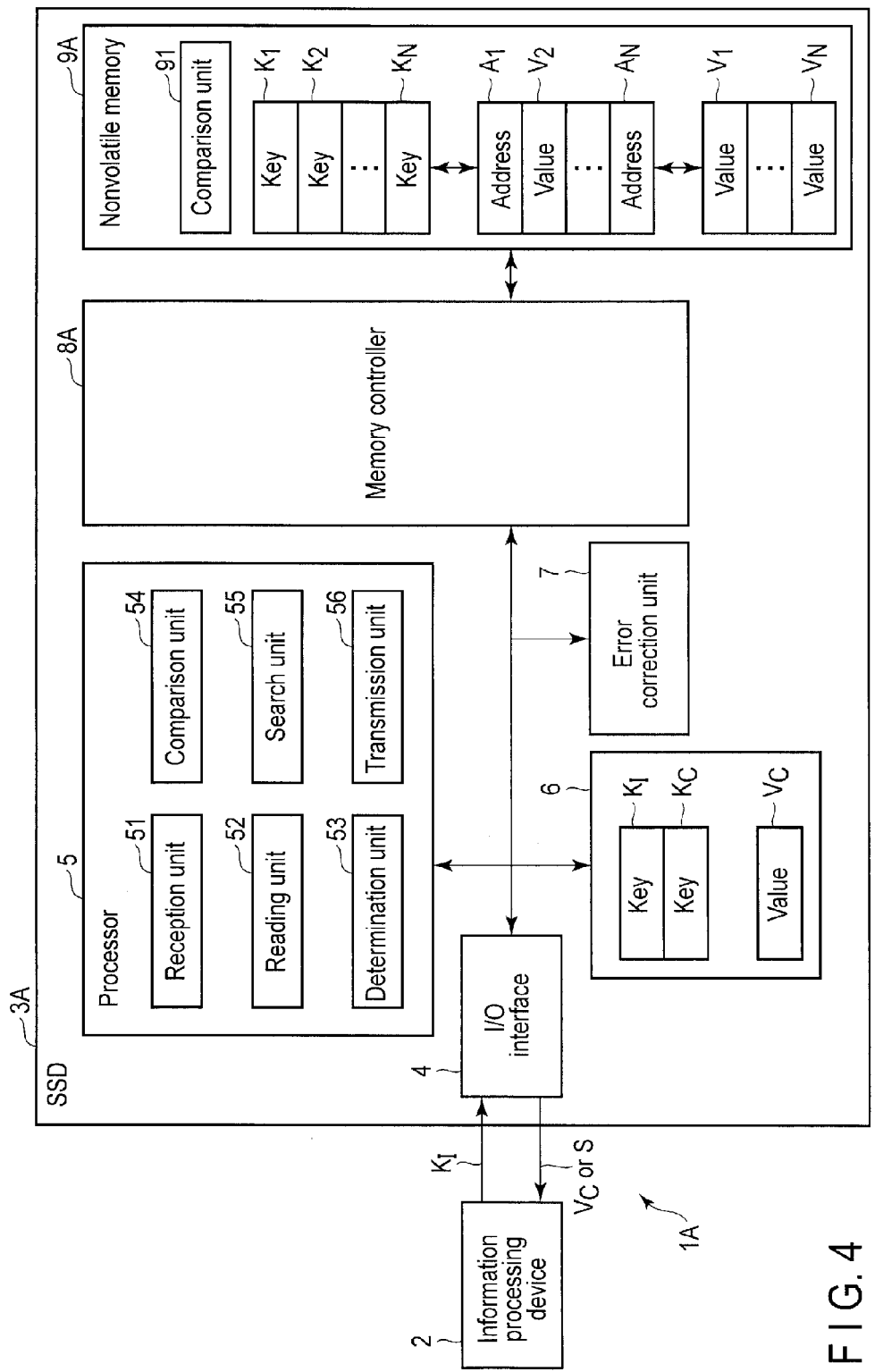
F I G. 4

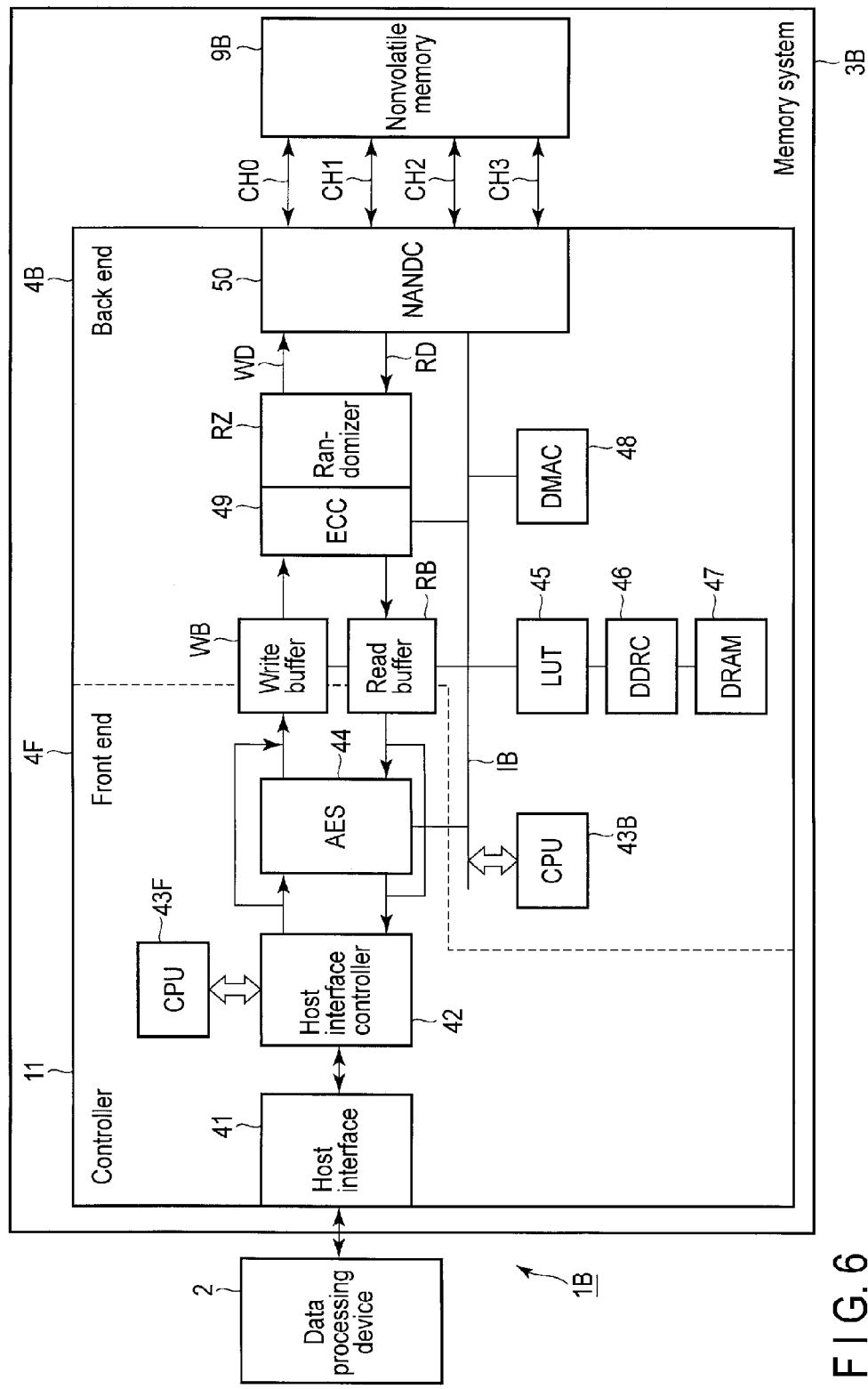
F I G. 6

SEARCH DEVICE AND SEARCH METHOD SEARCHING DATA BASED ON KEY

CROSS-REFERENCE TO RELATED APPLICATIONS

This application is based upon and claims the benefit of priority from U.S. Provisional Application No. 62/104,298, filed Jan. 16, 2015; and Japanese Patent Application No. 2015-028417, filed Feb. 17, 2015, the entire contents of all of which are incorporated herein by reference.

FIELD

Embodiments described herein relate generally to a search device and a search method searching data based on a key.

BACKGROUND

There is a demand to shorten search time in a memory system which executes a key-value search. Thereby, a solid state drive (SSD) accessible fast is used as the memory system which executes the key-value search. For example, the solid state drive (SSD) includes a nonvolatile semiconductor memory such as a NAND flash memory. The NAND flash memory includes a plurality of blocks (physical blocks). The plurality of blocks include a plurality of memory cells arranged at crossing points of word lines and bit lines.

BRIEF DESCRIPTION OF THE DRAWINGS

FIG. 1 is a block diagram showing an example of a data processing system including a memory system according to a first embodiment.

FIG. 3 is a circuit diagram showing an example of a relationship between a memory in which the read key is stored, a comparison module and nonvolatile memory according to the first embodiment.

FIG. 4 is a block diagram showing an example of a data processing system including a memory system according to a second embodiment.

FIG. 6 is a block diagram showing an example of a detail structure of a data processing system according to a third embodiment.

DETAILED DESCRIPTION

Figure 2:
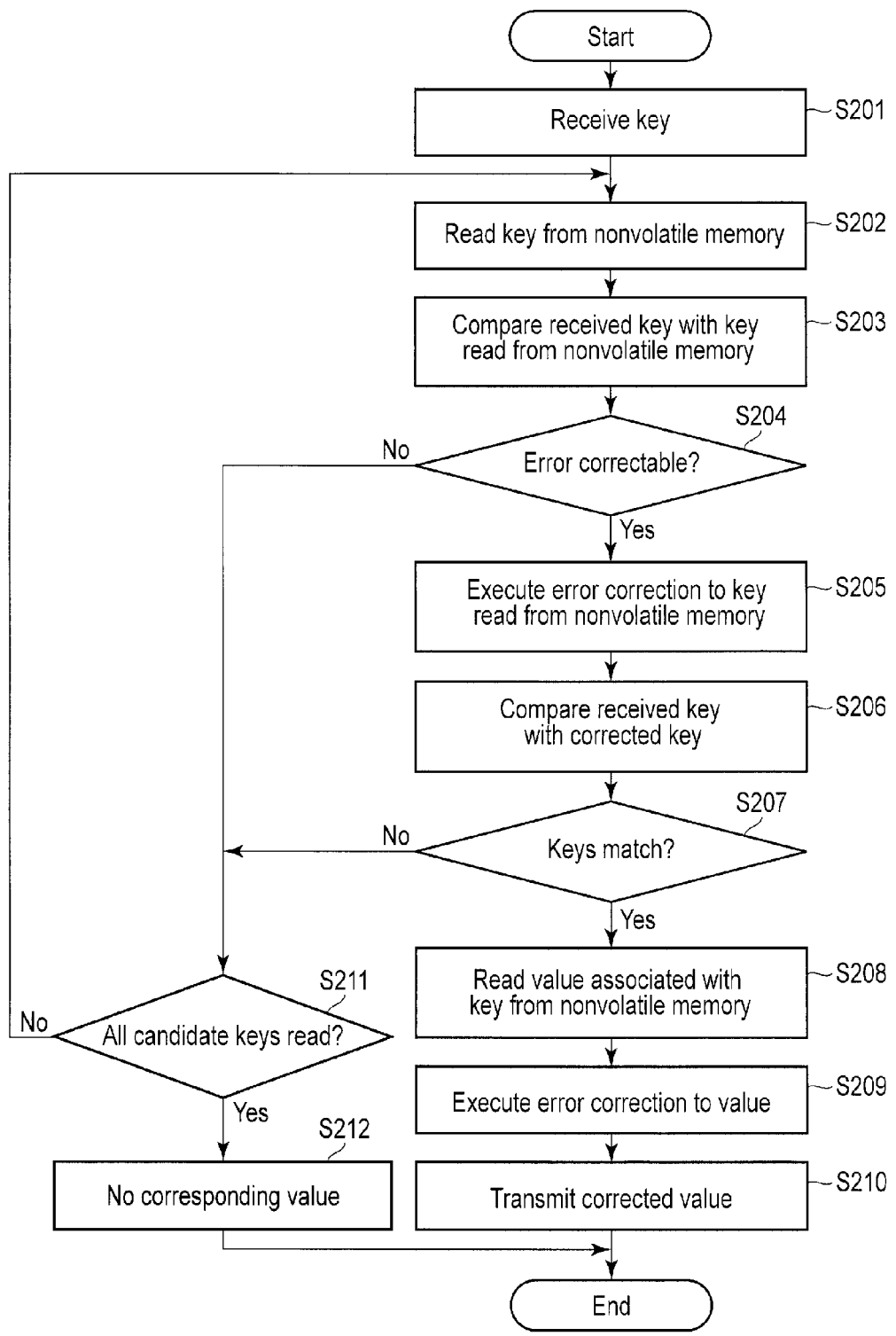
FIG. 2 is a flowchart showing an example of a process of the memory system according to the first embodiment.

In general, according to one embodiment, a search device includes a first comparison module, a determination module, a correction module, a second comparison module, and a search module. The first comparison module compares a received first key with a second key read from a nonvolatile memory. The determination module determines whether error correction is possible based on a first comparison result obtained by the first comparison module. The correction module generates a third key by applying an error correction process to the second key if the determination module determines that error correction is possible. The second comparison module compares the first key with the third key. The search module reads data associated with the second key in the nonvolatile memory if a second comparison result obtained by the second comparison module shows a match.

Embodiments will be described hereinafter with reference to drawings. In a following description, the same reference numerals denote components having nearly the same functions and arrangements, and a repetitive description thereof will be given if necessary.

[First Embodiment]

In the present embodiment, this specification explains a search device provided in a memory device. The memory device includes a nonvolatile memory.

In the present embodiment, this specification explains a case where the nonvolatile memory is a NAND flash memory and the memory device is an SSD. However, the nonvolatile memory may be, for example, a NOR flash memory, a magnetoresistive random access memory (MRAM), a phase-change random access memory (PRAM), a resistive random access memory (ReRAM) or a ferroelectric random access memory (FeRAM). A part of or the whole part of the memory device may be a hard disk drive (HDD).

In the present embodiment, the data read from the nonvolatile memory may include an error.

In the present embodiment, the term "access" refers to both writing data to a storage device and reading data from a storage device.

FIG. 1 is a block diagram showing an example of a data processing system including an SSD according to the present embodiment.

A data processing system 1 includes a data processing device 2 and an SSD 3 which is an example of a memory device. The data processing device 2 may be a host device corresponding to the SSD 3.

The data processing device 2 transmits key $K_I$ to the SSD 3 and receives, from the SSD 3, data (hereinafter, referred to as value) $V_C$ corresponding to Key $K_I$ or a signal S which indicates that the value corresponding to key $K_I$ is not present in a nonvolatile memory 9 of the SSD 3.

The SSD 3 receives key $K_1$ from the data processing device 2 and transmits value $V_c$ corresponding to key $K_I$ or the signal S to the data processing device 2. The SSD 3 may be incorporated into the data processing device 2. The data processing device 2 and the SSD 3 may be communicably connected via a network, etc.

The SSD 3 includes an I/O interface 4, a processor 5, a memory 6, an error correction module 7, a memory controller 8 and the nonvolatile memory 9.

The I/O interface 4 transmits and receives, for example, data, information, signals and commands to/from an external device such as the data processing device 2.

The processor 5 functions as a reception module 51, a reading module 52, a determination module 53, a comparison module 54, a search module 55 or a transmission module 56 by executing a program stored in a memory of the processor 5, a program stored in the memory 6 or a program stored in the nonvolatile memory 9.

In the present embodiment, the program for causing the processor 5 to function as the reception module 51, the reading module 52, the determination module 53, the comparison module 54, the search module 55 or the transmission module 56 may be, for example, middleware, firmware, an application program or an operating system (OS). In the present embodiment, a part of or all of the reception module 51, the reading module 52, the determination module 53, the comparison module 54, the search module 55 and the transmission module 56 may be installed as hardware.

For example, programs, data and information to be processed by the processor 5 are stored in the memory 6. The memory 6 is used as a working memory. The memory 6 may be a volatile memory such as a dynamic random access memory (DRAM) or a static random access memory (SRAM) or may be a nonvolatile memory.

The memory controller 8 controls the access to the nonvolatile memory 9. In the present embodiment, the memory controller 8 includes a memory 81 and a comparison module 82. A part of or the whole part of the comparison module 82 provided in the memory controller 8 may be installed as hardware or as software. The comparison module 82 may be allocated outside the memory controller 8. For example, the comparison module 82 may be provided in the nonvolatile memory 9.

Keys $K_1, K_2, \ldots, K_N$ which are candidate keys, address $A_1$, value $V_2, \ldots$, address $A_N$ associated with keys $K_1, K_2, \ldots, K_N$, respectively, and values $V_1, \ldots, V_N$ allocated in positions indicated by address $A_1, \ldots$, address $A_N$ are stored in the nonvolatile memory 9.

In the present embodiment, keys $K_1$ and $K_N$ are allowed to refer to values $V_1$ and $V_N$ by using addresses $A_1$ and $A_N$. Key $K_2$ is allowed to directly refer to value $V_2$ without using an address.

The reception module 51 receives key $K_1$ from the data processing device 2 via the I/O interface 4 and writes the received key $K_I$ to the memory 6.

In the present embodiment, key $K_I$ is a key received by the SSD 3 from the external data processing device 2. However, key $K_I$ may be a key produced by a process inside the SSD 3. The reception module 51 may be a reception module which receives the key produced by the process inside the SSD 3.

The reading module 52 reads an unconfirmed key out of the candidate keys from the nonvolatile memory 9 by using the memory controller 8 and writes the read key $K_R$ to the memory 81. The reading module 52 reads an unconfirmed key out of the candidate keys based on, for example, a binary search.

The memory 81 is, for example, a register or a buffer. Key $K_R$ read from the nonvolatile memory 9 is stored in the memory 81.

The comparison module 82 reads the received key $K_I$ written to the memory 6 and the read key $K_R$ stored in the memory 81. The comparison module 82 compares key $K_I$ with key $K_R$. For example, the comparison module 82 calculates the Hamming distance by comparing the data of each bit of key $K_I$ with the data of each bit of key $K_R$ and adding the number of different bits. The Hamming distance is equivalent to the number of different components (data items) out of pairs of components which are in corresponding positions in two binary code strings (data items) of equal length.

In the present embodiment, this specification explains an example in which the similarity between key $K_I$ and key $K_R$ is shown by the Hamming distance. However, the similarity between key $K_I$ and key $K_R$ may be determined based on various methods. For example, the similarity may be determined by using the cosine distance or the Euclidean distance.

The determination module 53 determines whether or not error correction is possible based on the comparison result (first comparison result) obtained by the comparison module 82. In other words, the determination module 53 determines whether or not the comparison result obtained by the comparison module 82 shows that error correction is possible. For example, the determination module 53 determines whether or not key $K_I$ is within a range which allows error correction of key $K_R$ based on whether or not the Hamming distance is within a range which allows error correction.

The expression "error correction is possible" or "within a range which allows error correction" means that an error generated in key $K_R$ or data is within the range of the error correction capability of the error correction module 7. For example, if the Hamming distance between key $K_I$ and key $K_R$ is less than or equal to a value indicating the correction capability of the error correction module 7, the determination module 53 determines that the Hamming distance between key $K_I$ and key $K_R$ is within the correctable range.

If the comparison result obtained by the comparison module 82 shows that error correction is possible, the error correction module 7 applies an error correction process to the read key $K_R$ stored in the memory 81, generates a corrected key $K_C$, and writes the corrected key $K_C$ to the memory 6. Various methods can be employed for the error correction process applied by the error correction module 7. For example, an error can be corrected based on block codes or convolution codes.

The comparison module 54 reads the received key $K_I$ and the corrected key $K_C$ from the memory 6, compares key $K_I$ with key $K_C$ and determines whether or not they match.

In the present embodiment, a match is not limited to a perfect match. A match may be some degree of approximation such as a match within a predetermined range (that is, a partial match). For example, a match may include a case of determining that a target should be extracted in a fuzzy search. The fuzzy search is a search method by which a target which does not perfectly match search conditions is extracted under certain conditions.

For example, the comparison module 54 may compare the data of each bit of key $K_I$ with the data of each bit of key $K_C$ and determine that key $K_I$ match key $K_C$ if the number of different bits is less than or equal to a predetermined value. For example, the comparison module 54 may compare the data of each bit of key $K_I$ with the data of each bit of key $K_C$ and determine that key $K_I$ match key $K_C$ if the number of same bits is greater than or equal to a predetermined value.

If the comparison result obtained by the comparison module 54 shows a match, the search module 55 reads the value associated with the read key $K_R$ in the nonvolatile memory 9 via the memory controller 8. For example, the search module 55 executes a key-value search.

The error correction module 7 applies an error correction process to the value read by the search module 55 and writes the corrected value $V_C$ to the memory 6. A part of or the whole part of the error correction module 7 may be installed as hardware or as software. For example, the error correction module 7 may be included in the processor 5 or may be included in the memory controller 8.

The transmission module 56 reads value $V_C$ from the memory 6 and transmits value $V_C$ to the data processing device 2 via the I/O interface 4.

If the comparison result obtained by the comparison module 82 shows that error correction is not possible, or if the comparison result obtained by the comparison module 54 shows a mismatch, the reading module 52 reads the next key which has not been read yet out of the candidate keys of the nonvolatile memory 9, and writes the read next key $K_R$ to the memory 81.

The comparison module 82 compares the received key $K_I$ stored in the memory 6 with the read next key $K_R$ stored in the memory 81.

If all of the candidate keys corresponding to key $K_I$ have been read from the nonvolatile memory 9 by the reading module 52, and no value is read by the search module 55 from the nonvolatile memory 9, the transmission module 56 transmits a signal S indicating that the value corresponding to key $K_I$ has not been written to the nonvolatile memory 9 to the data processing device 2 via the I/O interface 4.

For example, the signal S is a signal indicating that an appropriate search result was not obtained relative to key $K_I$; for example, a signal indicating that the number of hit values relative to key $K_I$ is zero.

FIG. 2 is a flowchart showing an example of a process of the SSD 3 according to the present embodiment.

In step S201, the reception module 51 receives key $K_I$ from the data processing device 2 via the I/O interface 4 and writes the received key $K_I$ to the memory 6.

In step S202, the reading module 52 reads an unconfirmed key out of the candidate keys from the nonvolatile memory 9 and writes the read key $K_R$ to the memory 81.

In step S203, the comparison module 82 compares the received key $K_I$ stored in the memory 6 with the read key $K_R$ stored in the memory 81.

In step S204, the determination module 53 determines whether error correction is possible based on the comparison result obtained by the comparison module 82.

If the determination module 53 determines that error correction is not possible based on the comparison result obtained by the comparison module 82, the process proceeds to step S211.

If the determination module 53 determines that error correction is possible based on the comparison result obtained by the comparison module 82, the error correction module 7 applies an error correction process to key $K_R$ which is read from the nonvolatile memory 9 and written to the memory 81, and writes the corrected key $K_C$ to the memory 6 in step S205.

In step S206, the comparison module 54 compares the received key $K_1$ stored in the memory 6 with the corrected key $K_C$ stored in the memory 6. In step S207, the comparison module 54 determines whether or not key $K_I$ matches key Kc.

If key $K_I$ does not match key $K_C$, the process proceeds to step S211.

If key $K_I$ matches key $K_C$, the search module 55 reads the value associated with the read key $K_R$ in the nonvolatile memory 9 via the memory controller 8 in step S208.

In step S209, the error correction module 7 applies an error correction process to the value read by the search module 55 and writes the corrected value $V_C$ to the memory 6.

In step S210, the transmission module 56 reads the corrected value $V_C$ from the memory 6 and transmits value $V_C$ to the data processing device 2 via the I/O interface 4. Thus, the process ends.

If the determination module 53 determines that error correction is not possible based on the comparison result obtained by the comparison module 82 in step S204, or if key $K_I$ does not match key $K_C$ in step S207, the reading module 52 determines whether or not all of the candidate keys written to the nonvolatile memory 9 have been read in step S211.

When all candidate keys have not been read, the process proceeds to step S202. The reading module 52 reads the next key from the nonvolatile memory 9 and writes the read next key $K_R$ to the memory 81. The subsequent steps are executed in the manner explained above.

If the reading module 52 determines that all of the candidate keys have been read in step S211, the transmission module 56 transmits a signal S indicating that the value corresponding to key $K_I$ has not been written to the nonvolatile memory 9 to the data processing device 2 via the I/O interface 4 in step S212.

FIG. 3 is a circuit diagram showing an example of the relationship between the memory 81 in which the read key $K_R$ is stored, the comparison module 82 and the nonvolatile memory 9 according to the present embodiment.

The nonvolatile memory 9 includes a plurality of memory cells 101 for storing data and a plurality of amplifiers 102 which amplify a signal related to the data read from the memory cells 101.

In the nonvolatile memory 9, each memory cell 101 is the minimum circuit for storing data and is allocated in the intersection of a word line and a bit line. In the present embodiment, this specification shows an example in which data is read from the memory cells 101. However, for example, if the nonvolatile memory 9 is an HDD, the data stored in a sector is read. In this manner, the target in which data is stored or from which data is read differs depending on the type of nonvolatile memory.

The key $K_R$ data read from the nonvolatile memory 9 is written to the memory 81.

For example, the comparison module 82 includes an exclusive OR (XOR) circuit or a coincidence circuit. The comparison module 82 outputs the result of comparison between the received key $K_I$ and the read memory $K_R$.

In the present embodiment, the signal related to key $K_R$ read from the memory cells 101 is amplified by the amplifiers 102 in such a way that the read key $K_R$ can be stored in the memory 81. The data (for example, bit data) related to $K_R$ stored in the memory 81 is serially input to a first input terminal of the comparison module 82. The data (for example, bit data) related to key $K_I$ is serially input to a second input terminal of the comparison module 82. The comparison module 82 compares the data which is related to key $K_R$ and input to the first input terminal with the data which is related to key $K_I$ and input to the second input terminal. The comparison 82 outputs the comparison result. The data input to the first and second input terminals of the comparison module 82 is not limited to binary data and may be multiple-valued data.

The effects to be obtained by the present embodiment are explained below.

For example, key $K_R$ read from the nonvolatile memory 9 may include an error. In a comparison example, an error correction process is executed every time key $K_R$ is read from the nonvolatile memory 9, and the corrected key $K_C$ is compared with the received key $K_R$. In the comparison example, an error correction process is applied to key $K_R$ many times. Thus, the search process requires time, and the power consumption of the SSD 3 is large.

In the present embodiment, firstly, the received key $K_I$ is compared with key $K_R$ read from the nonvolatile memory 9. Subsequently, if the comparison result is within a range which allows error correction, an error correction process is applied to key $K_R$ read from the nonvolatile memory 9. If the comparison result is outside the correctable range, the next candidate key $K_R$ is read from the nonvolatile memory 9, and the similar steps are repeated.

In the present embodiment, it is possible to decrease the number of error correction processes applied to key $K_R$ read from the nonvolatile memory 9, shorten the search time, efficiently execute a key-value search and reduce the power consumption of the SSD 3.

In the present embodiment, a key-value search is explained as an example of a search. However, other searches can be employed as long as it is possible to at least extract a received key, information, data or data related to a signal. For example, the present embodiment can be also applied when data corresponding to a plurality of keys is extracted.

[Second Embodiment]

In the present embodiment, a modification example of the first embodiment is explained. In the present embodiment, a comparison module which compares the received key $K_I$ with the read key $K_R$ is provided in a nonvolatile memory.

FIG. 4 is a block diagram showing an example of a data processing system including an SSD according to the present embodiment.

A data processing system 1A includes a data processing device 2 and an SSD 3A. A memory controller 8A of the SSD 3A may not include the memory 81 or the comparison module 82 of the first embodiment.

A nonvolatile memory 9A includes a comparison module 91 which compares the received key $K_I$ with the read key $K_R$.

Figure 5:
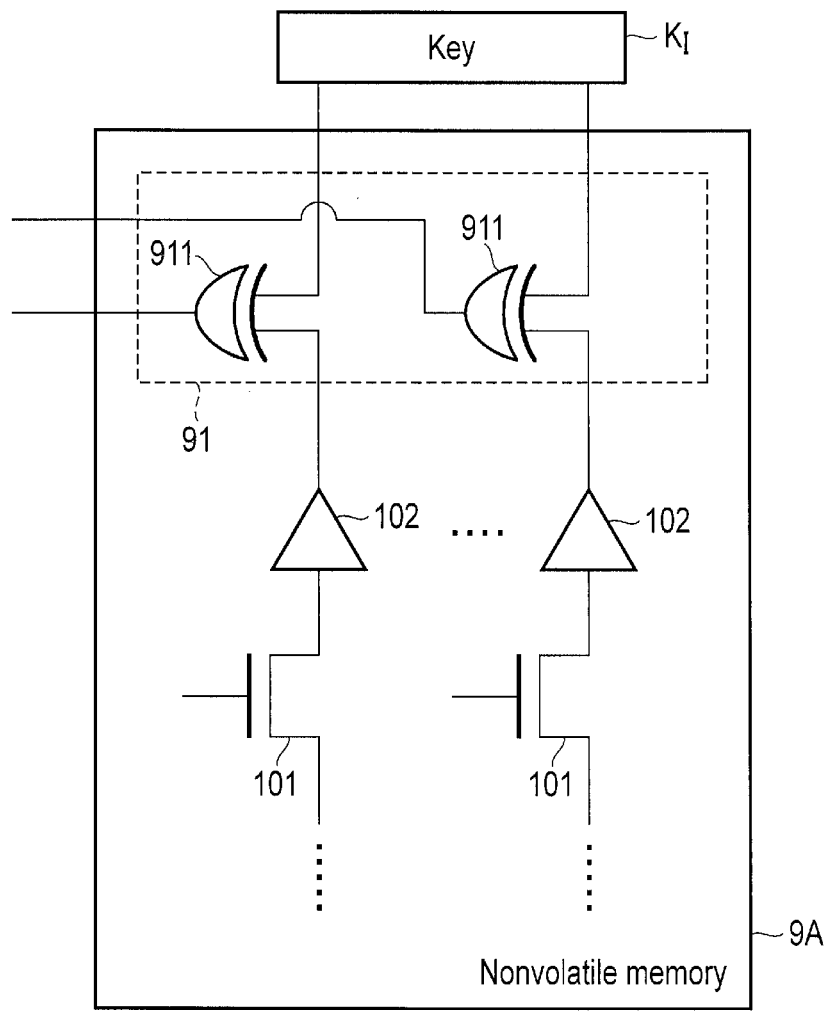
FIG. 5 is a circuit diagram showing an example of a relationship between a comparison module and memory cell of a nonvolatile memory according to the second embodiment.

FIG. 5 is a circuit diagram showing an example of the relationship between the comparison module 91 and a plurality of memory cells 101 of the nonvolatile memory 9A according to the present embodiment.

The nonvolatile memory 9A includes the memory cells 101 for storing data and a plurality of amplifiers 102 which amplify a signal related to the data read from the memory cells 101.

The comparison module 91 incorporated into the nonvolatile memory 9A compares the read key $K_R$ with the received key $K_I$ and outputs the comparison result. The comparison module 91 includes, for example, an exclusive OR (XOR) circuit or a coincidence circuit.

In the present embodiment, the comparison module 91 includes a plurality of comparison circuits 911. The data which is related to $K_R$ and read from the memory cells 101 is amplified by the amplifiers 102 in such a way that the data can be compared in the comparison circuits 911. The data (for example, bit data) which is related to $K_R$ and amplified by the amplifiers 102 is input to a first input terminal of each comparison circuit 911. The data (for example, bit data) related to key $K_I$ is input to a second input terminal of each comparison circuit 911. The comparison circuits 911 compare the data which is related to $K_R$ and input to the first input terminal with the data which is related to key $K_I$ and input to the second input terminal. The comparison circuits 911 output the comparison result. The data input to the first and second input terminals of the comparison circuits 911 is not limited to binary data and may be multiple-valued data.

In the above embodiment, it is possible to make a key-value search more efficient by using the comparison module 91 incorporated into the nonvolatile memory 9A. Thus, effects which are similar to those of the first embodiment can be obtained from the present embodiment. In the present embodiment, the modification of the memory controller 8A can be reduced.

[Third Embodiment]

In the present embodiment, the data processing system 1 and 1A explained in the first and second embodiments are further explained in detail.

FIG. 6 is a block diagram showing an example of a detail structure of the data processing system according to the present embodiment.

The data processing system 1B includes the data processing device 2 and a memory system 3B.

The memory system 3B according to the present embodiment can read value $V_C$ based on key $K_I$ and can read the data based on a logical block adores.

The SSD 3 and 3A according to the first and second embodiments corresponds to the memory system 3B.

The processor of the SSD 3, 3A corresponds to a CPU 43F, 43B.

The I/O interface 4 corresponds to host interface 41.

The memory 6 corresponds to a DRAM 7.

The error correction module 7 corresponds to a Error Code Correction (ECC) 49.

The memory controller 8 or 8A corresponds to a NAND Controller (NANDC) 50.

The nonvolatile memory 9 or 9A corresponds to a nonvolatile memory 9B.

The data processing device 2 functions as a host device.

A controller 11 of the memory system 3B includes a front end 4F and a back end 4B.

The front end (host communication unit) 4F includes a host interface 41, host interface controller 42, encode/decode unit (Advanced Encryption Standard (AES)) 44, and CPU 43F.

The host interface 41 communicates with the data processing device 2 to exchange requests (write command, read command, erase command), Logical Block addressing (LBA), data, key $K_I$, key $K_C$ and signal S.

The host interface controller (control unit) 42 controls the communication of the host interface 41 based on the control of the CPU 43F.

The encode/decode unit 44 encodes the write data (plaintext) transmitted from the host interface controller 42 in a data write operation. The encode/decode unit 44 decodes encoded read data transmitted from the read buffer RB of the back end 4B in a data read operation. Note that the transmission of the write data and read data can be performed without using the encode/decode unit 44 as occasion demands.

The CPU 43F controls the above components 41, 42, and 44 of the front end 4F to control the whole function of the front end 4F.

The back end (memory communication unit) 4B includes a write buffer WB, read buffer RB, LUT 45, DDRC 46, DRAM 47, DMAC 48, ECC 49, randomizer RZ, NANDC 50, and CPU 43B.

The write buffer (write data transfer unit) WB stores the write data transmitted from the data processing device 2 temporarily. Specifically, the write buffer WB temporarily stores the data until it reaches to a predetermined data size suitable for the nonvolatile memory 9B.

The read buffer (read data transfer unit) RB stores the read data read from the nonvolatile memory 9B temporarily. Specifically, the read buffer RB rearranges the read data to be the order suitable for the data processing device 2 (the order of the logical address LBA designated by the data processing device 2).

The LUT 45 is a data to translate the logical address an LBA into a physical address PBA (Physical Block Addressing).

The DDRC 46 controls double data rate (DDR) in the DRAM 47.

The DRAM 47 is a nonvolatile memory which stores, for example, the LUT 45.

The direct memory access controller (DMAC) 48 transfers the write data and the read data through an internal bus IB. In FIG. 6, only a single DMAC 48 is shown; however, the controller 11 may include two or more DMACs 48. The DMAC 48 may be set in various positions inside the controller 11.

The ECC (error correction unit) 49 adds an error correction code (ECC) to the write data transmitted from the write buffer WB. When the read data is transmitted to the read buffer RB, the ECC 49, if necessary, corrects the read data read from the nonvolatile memory 24 using the added ECC.

The randomizer RZ (or scrambler) disperses the write data in such a manner that the write data are not biased in a certain page or in a word line direction of the nonvolatile memory 9B in the data write operation. By dispersing the write data in this manner, the number of write can be standardized and the cell life of the memory cell MC of the nonvolatile memory 9B can be prolonged. Therefore, the reliability of the nonvolatile memory 9B can be improved. Furthermore, the read data read from the nonvolatile memory 9B passes through the randomizer RZ in the data read operation.

The NAND controller (NANDC) 50 uses a plurality of channels (four channels CH0 to CH3 are shown in the Figure) to access the nonvolatile memory 9B in parallel in order to satisfy a demand for a certain speed.

The CPU 43B controls each component above (45 to 50, and RZ) of the back end 4B to control the whole function of the back end 4B.

Note that the structure of the controller 11 is an example and no limitation is intended thereby.

Figure 7:
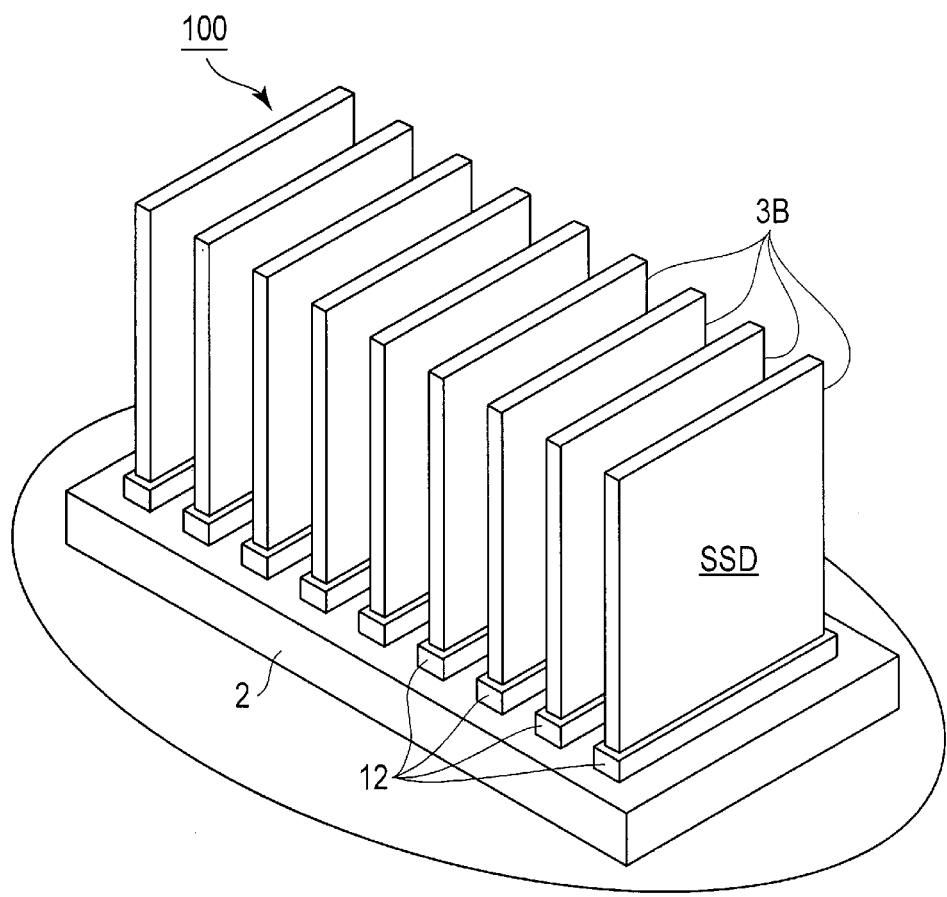
FIG. 7 is a perspective view showing an example of a storage system according to the third embodiment.

FIG. 7 is a perspective view showing an example of a storage system according to the present embodiment.

A storage system 100 includes the memory system 3B as an SSD.

The memory system 3B is, for example, a relatively small module. Note that the size and scale of the memory system 3B is not limited thereto and may be changed into various sizes arbitrarily.

Furthermore, the memory system 3B may be applicable to the data processing device 2 as a server used in a data center or a cloud computing system employed in a company (enterprise) or the like. Thus, the memory system 3B may be an enterprise SSD (eSSD).

The memory system 3B includes a plurality of connectors (for example, slots) 12 opening upwardly, for example. Each connector 12 is a serial attached SCSI (SAS) connector or the like. With the SAS connector, a high speed mutual communication can be established between the data processing device 2 and each memory system 3B. Note that, the connector 38 may be a PCI express (PCIe) or NVM express (NVMe).

A plurality of memory systems 3B are individually attached to the connectors 12 of the data processing device 2 and supported in such an arrangement that they stand in an approximately vertical direction. Using this structure, a plurality of memory systems 3B can be mounted collectively in a compact size, and the memory systems 3B can be miniaturized. Furthermore, the shape of each memory system 3B of the present embodiment is 2.5 inch small form factor (SFF). With this shape, the memory system 3B can be compatible with an enterprise HDD (eHDD) and the easy system compatibility with the eHDD can be achieved.

Note that the memory system 3B is not limited to the use in an enterprise HDD. For example, the memory system 3B can be used as a memory medium of a consumer electronic device such as a notebook portable computer or a tablet terminal.

As can be understood from the above, the data processing system 1B and the storage system 100 having the structure of the present embodiment can achieve a mass storage advantage with the same advantages of the first and the second embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A search device comprising:
  a first comparison unit which compares a received first key with a second key read from a nonvolatile memory;
  a determination unit which determines, based on a first comparison result obtained by the first comparison unit, whether or not a difference between the first key and the second key is within a range of an error correction capability of an error correction process;
  a correction unit which generates a third key by applying the error correction process to the second key if the determination unit determines that the difference is within the range;
  a second comparison unit which compares the first key with the third key; and
  a search unit which reads data associated with the second key in the nonvolatile memory if a second comparison result obtained by the second comparison unit shows a match.

2. The search device of claim 1, wherein
  the first comparison unit compares the first key with a next second key read from the nonvolatile memory if the determination unit determines that the difference is not within the range or if the second comparison result shows a mismatch,
  the determination unit determines, based on a comparison result between the first key and the next second key, whether or not a difference between the first key and the next second key is within the range,
  the correction unit generates a next third key by applying the error correction process to the next second key if the determination unit determines that the difference between the first key and the next second key is within the range,
  the second comparison unit compares the first key with the next third key, and
  the search unit reads data associated with the next second key in the nonvolatile memory if the first key matches the next third key.

3. The search device of claim 1, wherein
  the first comparison unit calculates a Hamming distance based on the first key and the second key, and
  the determination unit determines whether the Hamming distance is within the range.

4. The search device of claim 1, further comprising
  a transmission unit which transmits a signal indicating that data corresponding to the first key is not present in the nonvolatile memory to an information processing device, if all of candidate keys corresponding to the first key have been read from the nonvolatile memory and the data corresponding to the first key is not read.

5. The search device of claim 1, wherein the correction unit corrects an error of the data read by the search unit.

6. The search device of claim 1, wherein the correction unit corrects an error of the second key based on an error correcting code (ECC).

7. The search device of claim 1, wherein the first comparison unit is provided in a memory controller which controls writing and reading relative to the nonvolatile memory.

8. The search device of claim 1, wherein the first comparison unit is provided in the nonvolatile memory.

9. The search device of claim 1, wherein the search unit executes a key-value search.

10. The search device of claim 1, wherein the nonvolatile memory is a NAND flash memory.

11. A search device comprising:
   a determination unit which determines whether or not a difference between a received first key and a second key read from a nonvolatile memory is within a range of an error correction capability of an error correction process;
   a correction unit which generates a third key by applying the error correction process to the second key if the determination unit determines that the difference is within the range; and
   a search unit which reads data associated with the second key in the nonvolatile memory if the first key matches the third key.

12. A search method comprising:
   generating a first comparison result by comparing a received first key with a second key read from a nonvolatile memory;
   generating a determination result by determining, based on the first comparison result, whether or not a difference between the first key and the second key is within a range of an error correction capability of an error correction process;
   generating a third key by applying the error correction process to the second key if the determination result indicates that the difference is within the range;
   generating a second comparison result by comparing the first key with the third key; and
   reading data associated with the second key in the nonvolatile memory if the second comparison result indicates a match.

13. The search method of claim 12, further comprising:
   generating a next first comparison result by comparing the first key with a next second key read from the nonvolatile memory if the determination result indicates that the difference is not within the range or if the second comparison result indicates a mismatch;
   generating a next determination result by determining, based on the next first comparison result, whether or not a difference between the first key and the next second key is within the range;
   generating a next third key by applying the error correction process to the next second key if the next determination result indicates that the difference between the first key and the next second key is within the range;
   generating a next second comparison result by comparing the first key with the next third key; and
   reading data associated with the next second key in the nonvolatile memory if the next second comparison result indicates a match.

14. The search method of claim 12, wherein
   the generating the first comparison result comprises calculating a Hamming distance based on the first key and the second key, and
   the generating the determination result comprises determining whether the Hamming distance is within the range.

15. The search method of claim 12, further comprising:
   transmitting a signal indicating that data corresponding to the first key is not present in the nonvolatile memory to an information processing device, if all of candidate keys corresponding to the first key have been read from the nonvolatile memory and the data corresponding to the first key is not read.

16. The search method of claim 12, further comprising:
   correcting an error of the data read from the nonvolatile memory.

17. The search method of claim 12, wherein the error correction process corrects the second key based on an error correcting code (ECC).

18. A search device comprising:
   a first comparison unit which compares a received first key with a second key read from a nonvolatile memory;
   a determination unit which determines, based on a first comparison result obtained by the first comparison unit, whether or not a difference between the first key and the second key is within a range of an error correction capability of an error correction process; and
   a correction unit which generates a third key by applying the error correction process to the second key if the determination unit determines that the difference is within the range.

* * * * *